United States Patent
Wu et al.

(10) Patent No.: US 9,439,331 B1
(45) Date of Patent: Sep. 6, 2016

(54) COST-EFFECTIVE COOLING METHOD FOR COMPUTER SYSTEM

(71) Applicants: Banqiu Wu, San Jose, CA (US); Ming Xu, San Jose, CA (US)

(72) Inventors: Banqiu Wu, San Jose, CA (US); Ming Xu, San Jose, CA (US)

(*) Notice: Subject to any disclaimer, the term of this patent is extended or adjusted under 35 U.S.C. 154(b) by 0 days.

(21) Appl. No.: 14/672,196

(22) Filed: Mar. 29, 2015

(51) Int. Cl.
*H05K 7/20* (2006.01)
*G06F 1/20* (2006.01)

(52) U.S. Cl.
CPC .................................. *H05K 7/2079* (2013.01)

(58) Field of Classification Search
CPC .... H05K 7/20; H05K 7/1497; H05K 7/2079; G06F 1/20; H01L 23/34; H01L 23/473; H01L 23/4735; F28F 3/08; F28F 7/00; F28F 3/02; F28D 15/00
USPC .............. 361/679.46–679.53, 688, 689, 698, 361/699, 702–722; 165/45, 97, 104.19, 165/104.33, 244, 247, 80.2, 80.4, 80.5; 257/713, 714, 715, 686, 774, 777; 62/259.2, 260, 235.1, 264
See application file for complete search history.

(56) References Cited

U.S. PATENT DOCUMENTS

| | | | | |
|---|---|---|---|---|
| 5,218,515 A * | 6/1993 | Bernhardt | ............. | H01L 23/473 257/712 |
| 6,208,512 B1 * | 3/2001 | Goldowsky | ............... | F04D 3/02 165/104.33 |
| 6,504,719 B2 * | 1/2003 | Konstad | .................... | G06F 1/20 165/104.32 |
| 7,525,207 B2 * | 4/2009 | Clidaras | ............... | F03B 13/1885 290/42 |
| 8,422,229 B2 * | 4/2013 | Madison, Jr. | ........... | F28D 15/00 29/890.03 |
| 8,448,876 B2 * | 5/2013 | Yang | ........................ | F24J 3/083 165/244 |
| 8,674,510 B2 * | 3/2014 | Law | ........................ | H01L 24/16 257/173 |
| 8,728,863 B2 * | 5/2014 | Nguyen | ................ | H01L 23/147 257/774 |
| 8,757,504 B2 * | 6/2014 | Yang | ........................ | F28D 15/00 165/45 |
| 9,299,641 B2 * | 3/2016 | Sekar | ................... | H01L 23/3677 |
| 2007/0271940 A1 * | 11/2007 | Yang | ......................... | F24J 3/06 62/260 |
| 2010/0314070 A1 * | 12/2010 | Yang | ........................ | F24J 3/083 165/45 |
| 2012/0243169 A1 * | 9/2012 | Rinke | ................ | H05K 7/20772 361/679.33 |
| 2013/0214142 A1 * | 8/2013 | Yang | ........................ | F24J 3/083 250/238 |
| 2014/0355202 A1 * | 12/2014 | Lecourtier | .............. | F28D 15/02 361/679.47 |
| 2015/0103490 A1 * | 4/2015 | Lee | ...................... | H05K 7/2079 361/695 |

* cited by examiner

*Primary Examiner* — Michail V Datskovskiy

(57) ABSTRACT

A computer system using regular IC or 3D IC is cooled by using liquid coolants such as water, oil, and ionic liquid. Liquid coolant flows in a closed coolant conduit which is configured to thermally contact heat-generating components in a computer system and a large water body such as river and reservoir. The heat created in computer system is carried out by liquid coolant and dissipated to large water body. The cooling system is simple and cost-effective.

15 Claims, 3 Drawing Sheets

COST-EFFECTIVE COOLING METHOD FOR COMPUTER SYSTEM

FIELD

The embodiment of present invention is generally related to liquid cooling system for heat-generating components of computers. More specifically, the present invention relates a cost-effective liquid cooling system in computer systems for regular integrated circuit and stacked three-dimensional (3D) integrated circuit (IC) used in data center.

BACKGROUND

Since it was invented in 1958, IC has been scaled to improve the performance. However, after the turn of the century, scaling resulted in short-channel effect and memory wall, which requires other approach to improve the IC performance more effectively.

3D IC offers a reasonable route to further improve IC performance. It improves IC performance by increasing device density, reducing the interconnect delay, and breaking memory wall with the application of 3D stacking using through silicon via (TSV). 3D IC also makes one chip package have more functional diversification than those enhanced only by shrinking the size of the features.

The main advantages of 3D IC are the smaller form factor, low energy consumption, high speed, and functional diversification. The biggest challenge in 3D IC stacking technology using TSV is thermal management owing to the high heat flux up to about 200 watts per square centimeter.

Data centers for internet and mobile devices are the most critical components in our information age. They serve industries, civil communications, military and defense applications, and transportations. Data centers consist of multiple computers usually called servers and switches. Both of them use many ICs. When a computer works, ICs will change status, or change the on-and-off status, which consumes electricity and generates significant heat. Even when computer system is at idle condition, it still consumes electricity due to the current leakage and circuit requirement.

It is predicted that 3D ICs will be an enabler for improvement of data center performance and efficiency with positive consequences for global energy consumption and environment. Disclosure of this invention will provide a cost-effective solution of 3D IC thermal management.

Multiple servers are accommodated in a server rack at data center. Each computer consumes significant electricity. It is common for a server (computer) to consume over a hundred watts. In a server rack, i.e. a module of servers, there are multiple computers. Similarly, there are many server racks in a data center. Therefore, a data center consumes large amount of electricity and a large data center consumes the same amount of electricity as a small or medium size town. Among the energy used in data centers, most electricity is consumed by servers and their cooling systems. It is quite often that cooling system uses the same amount of electricity as the server computers. It is estimated that the date centers consume about two percent of total electricity generated worldwide.

Power usage effectiveness (PUE) is usually used to measure the efficiency of a data center. It is defined as a ratio of total energy used by facility to that used by information technology (IT) equipment. An ideal PUE is 1.0, but average PUE worldwide now is about 2.0 although some data center claims their PUE is significantly below 2.0. The average PUE value of 2.0 indicates the necessity to improve the data center cooling effectiveness. One approach to improve the cooling efficiency is to use water cooling to replace current air cooling. In the past, water cooling was used for large scale computers, but did not obtain large scale application for personal computers or servers in data center because of its limitation by the shape of heat-generating components and thus the complexity.

As the dimensions of integrated circuit components decrease, more components are compacted in a given area of a semiconductor integrated circuit. Accordingly, more transistors are held on a given area and thus more heat is generated in the same area. In order to keep the IC temperature in allowed range for proper performance, heat generated has to be transferred out of integrated circuit effectively and economically. With the internet devices getting popular, more and more servers are installed and in service to support the internet function. The trend of applications of more mobile devices and cloud technology will drive more electricity consumption at data centers in the future.

Current servers are located in an air-conditioned environment, usually in a specially designed building. The heat generated by microprocessors, memory chips, and power supply chips is released locally, which is like a large heater in a room cooled by air conditioner. Due to the low efficiency of air conditioner, the cooling system uses lots of electricity, occupies large footprints, and causes high costs.

Accordingly, it is very significant to provide an effective method to reduce cooling power and improve cooling efficiency for computer system, especially for the system with large number of computers such as data center. Cooling technology now becomes an enabler to improve data center efficiency.

Improving cooling system in data center not only saves energy consumption, but also benefits ecological and environmental systems. Reduction of electricity consumption in data center cooling system will significantly decrease the emission of carbon dioxide amount, which equivalents to shut down multiple coal power plants with environmental benefit in addition to the cost reduction.

The heat generated in electronic devices in a data center has to be transferred outside the accommodating construction and dissipated to environment. In order to prevent the overheat of ICs, the surface of the ICs should be kept not very high, which means the temperature difference between high temperature source (IC surface) and low temperature environment is very low, resulting in the challenge in engineering realization and high costs in cooling system.

Traditionally, heat-generating components in computers are cooled by cold air supplied by air-conditioners. The air exchanges heat with heat generating components and dissipates it on chiller's cold surface. Lots of chillers and fans have to be used and thus cooling process consumes significant electricity and results in high costs. Lots of power is used by fans in the server rack to dissipate heat from component surface to air by blowing air through the server rack, consuming energy and making noise.

In order to lower the cost of using air conditioner, cold air is used to directly cool the heat generating components in winter at north areas. However, the air humanity has to be controlled well and the application is also limited by weather and season.

Now, cooling water is becoming popular for cooling the heat-generating components for computers. Current heat-generating components are mainly microprocessor unit (MPU), dynamic random-access memory (DRAM), and power chips. MPU has a flat shape and it is relatively easy to use liquid cooling on a flat surface. However, it is difficult to use liquid cooling on DRAM dual in-line memory module (DIMM) due to the irregular shape although some attempts were tried.

In order to overcome the intrinsic problem mentioned above, liquid cooling was used by circulating liquid coolant on the surface of ICs to improve the efficiency. However, this method has to use chillers to cool the liquid, resulting in a low cooling efficiency.

Therefore, natural water body was used for data center cooling. Air cooling of server rack was combined with heat dissipation to large natural water bodies such as ocean, river, and lake. However, there are lots of challenges for the realization of this method. In this invention, a cost-effective method is disclosed for improving server cooling and data center efficiency.

SUMMARY

Methods for cost-effective regular ICs or 3D ICs in a computer system are provided herein. In an embodiment, a cooling method includes: (a) circulating a liquid coolant to dissipate heat from regular of 3D IC heat-generating components such as MPU, memory chips, and power chips to the liquid coolant; (b) heat-dissipating from the liquid coolant directly to a large water body such as river, reservoir, and ocean.

In one embodiment, there are a coolant supply conduit and a coolant return conduit connecting liquid conduit on heat-generating components of regular ICs or on both sides of the IC package for 3D IC, the former supplies the coolant to heat-generating components in servers, and the latter carries the heated coolant out of heat-generating components for dissipating heat directly to a river or other large water body while the coolant is reused by circulation in a closed loop.

The most important thing for a reliable cooling performance is to keep the flow rate controllable in the cooling conduit on the heat-generating components. This is enabled by controlling the pressure in the supply conduit by using pumps and valves, large ratio of cross-sectional area of supply conduit to the sum of cooling conduit cross-sectional areas on the heat-generating components. The large cross-sectional area of supply conduit determines the constant pressure of liquid coolant and then the controllable flow rates in cooling conduit on each heat-generating component with reliable cooling performance.

It is very important that the coolant is all weatherproof liquid and pump maintenance is easy and reliable. In one embodiment of the invention, ionic liquid is used as a liquid coolant. It has a wide temperature range for liquid phase such as −100° C. to 400° C. with very stable properties. It has no visible vapor pressure, enabling high quality pumping performance.

In one embodiment, electromagnetic pump is used to drive the ionic liquid coolant to circulate in the closed loop. The electromagnetic pump is suitable for pumping ionic liquid coolant without direct contacting. Other advantages include high reliability and easy maintenance.

The liquid coolant conduit is directly merged into a river or a conduit of river water or other large water bodies for a simple structure and thus a low cost. Because natural water or other large water bodies may have mud, particles, and other solid impurities, a grate may be used to prevent dirty things attached on the outer surface of the coolant conduit merged into water.

Cooling conduit merged into river will cause temperature rise, but it is very limited, for example, three degrees, so that this cooling method is environmentally benign.

In winter season of north area, temperature is so low in north area that water in the large water body may freeze. In order to avoid possible damage on conduits caused by freezing, the conduits of the liquid coolant should have good protection such as underground arrangement. Such ideas are also applicable to other related parts like pumps.

The water level of the large water body changes with season or time, especially when the large water body is a river. Special attention should be paid for adjustment of the relative conduit location.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally provide apparatus and methods for removing heat from a regular IC or 3D IC computer system. Particularly, embodiments of the present invention provide a simple and cost-effective method and apparatus for removing heat from regular IC or 3D IC packages in computer system. In one embodiment, a liquid coolant is disposed contacting to the heat-generating IC components. The heat is carried out of the electronic devices by liquid coolant and dissipated to a large water body such as river, reservoir, or ocean.

Figure 1:
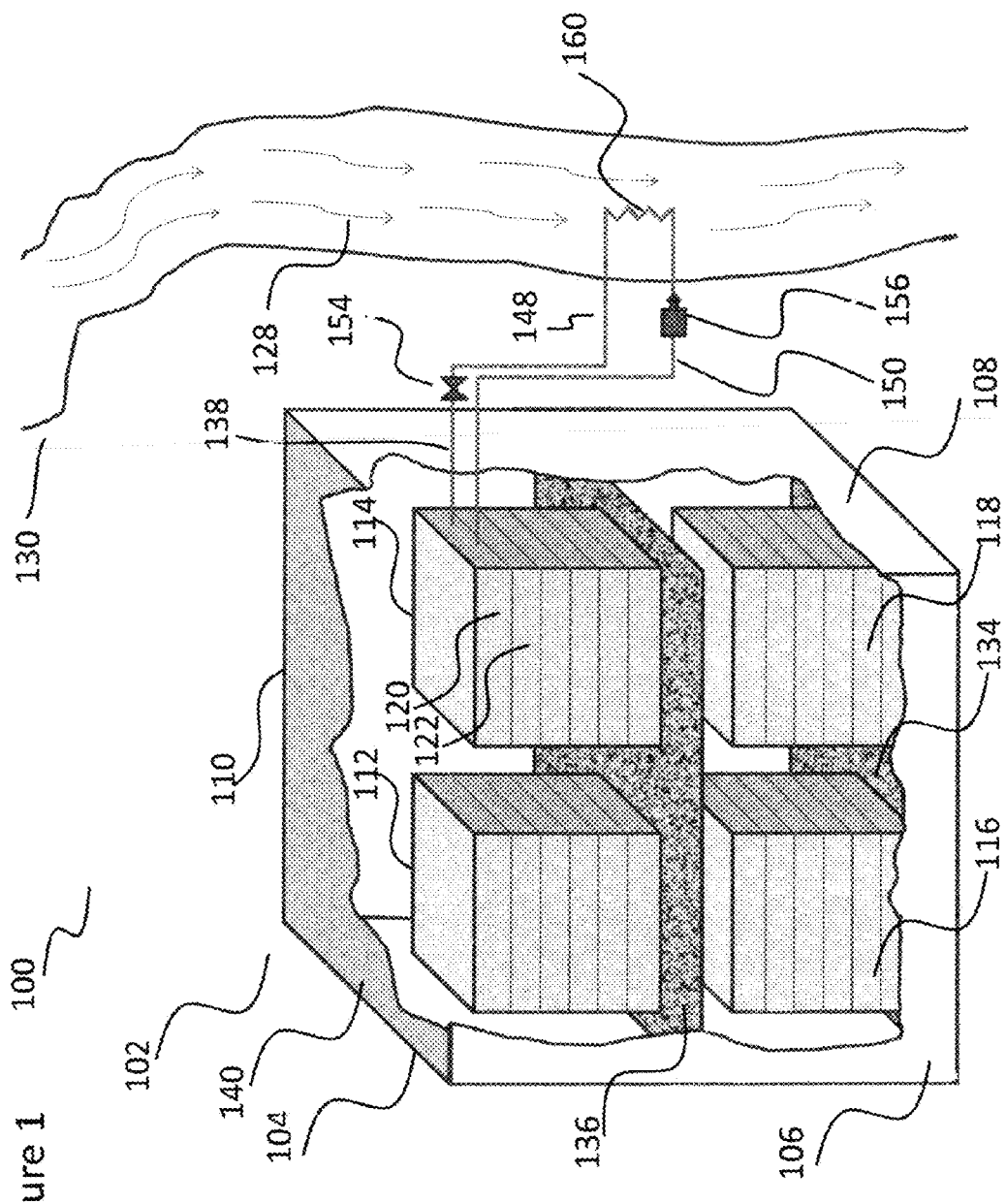
FIG. 1 depicts one embodiment of computer cooling system having regular ICs or 3D ICs in accordance with one embodiment of the invention.

FIG. 1 schematically illustrates a cooling system 100 in accordance with one embodiment of the present invention. The cooling system 100 generally comprises a building 102 configured to accommodate computers. The cooling system 100 further comprises a river 130 in connection with the building 102 via a supply conduit 148 and a return conduit 150.

The building 102 generally comprises a left sidewall 104, a front sidewall 106, a right sidewall 108, a back sidewall 110, and a roof 140. In one embodiment, the building 102 comprises first floor 134 and second floor 136.

The cooling system 100 comprises a server rack 116 and a server rack 118 on the first floor 134. The cooling system 100 also includes a server rack 112 and a server rack 114 on the second floor 136. A server rack usually accommodates multiple servers. In one embodiment, the server rack 114 accommodates a server 120 and a server 122.

The cooling system 100 is configured to position a liquid coolant supply conduit 148 to flow a liquid coolant 138 into the server 120 and carry heat out of the server 120 by flowing the liquid coolant 138 out of the server 120 in the return conduit 150. The liquid coolant supply conduit 148 and the return conduit 150 are connected to a merged conduit 160 to dissipate heat in the liquid coolant 138 to the river stream 128 in the river 130. The chip contact details will be further described below with references in FIG. 2 and FIG. 3.

During cooling process, the supply conduit 148 has a higher pressure compared with return conduit 150 to ensure the flow rate for cooling performance. The liquid coolant 138 in the supply conduit 148 has a lower temperature than the liquid coolant 138 in the return conduit 150. The liquid coolant 138 in the return conduit 150 transfers heat out of the server 120 to the water stream 128 in the river 130. During the cooling liquid 138 flowing through the emerged conduit 160, the temperature of the liquid coolant 138 decreases and attains such a low temperature when flowing out of the merged conduit 160 that the temperature meets the requirement for flowing into heat-generating components in the server 120.

The heat dissipation in the river 130 can be configured for cooling of one server, or one server rack, or multiple server racks. When heat dissipation is for cooling of multiple servers, the constant pressures in the supply conduit 148 and the return conduit 150 should be kept well. The liquid coolant 138 should be stable and flow-rate controllable without bubbles to ensure the quality of cooling and heat exchanging.

The heat exchange of the emerged conduit 160 in the river 130 may have high heat exchange efficiency due to the high density of liquid. The temperature difference between the supply conduit 148 and the return conduit 150 is low to avoid high temperature variation in heat-generating components in computer system. Typical temperature difference between these two conduits is 10-30° C. The circulation of the liquid coolant 138 is driven by a pump 156 in order to have an acceptable heat exchanging rate on the surface of heat-exchanging components.

During cooling processing of one embodiment for data center located in north cold area, the supply conduit 148 and the return conduit 150 are laid underground to avoid freezing in winter. Similarly, the pump 156 should be protected well during winter for data center located in north area.

According to one embodiment of the invention, a regulating valve 154 is used to adjust the flow rate of the liquid coolant 138 by varying the opening.

In one embodiment, a grate and filter is used close to the emerged conduit 160 to keep the contaminants out of the cooling system. In addition, the elevation of the emerged conduit 160 for heat exchanging in the river 130 may be adjusted according to the level of river, especially in the north area where river water level changes with season significantly.

For convenience of operation, the building 102 should be located close to the river 130 to reduce the length of the conduits. To ensure the performance of the cooling system 100, the river current 128 should be high enough for cooling of a data center. Generally, the river stream 128 should have a discharge of 40 m³/s or higher for cooling of a large data center.

In one embodiment, the liquid coolant 138 is deionized water. In another embodiment, the liquid coolant 138 is oil or ionic liquid.

Figure 2:
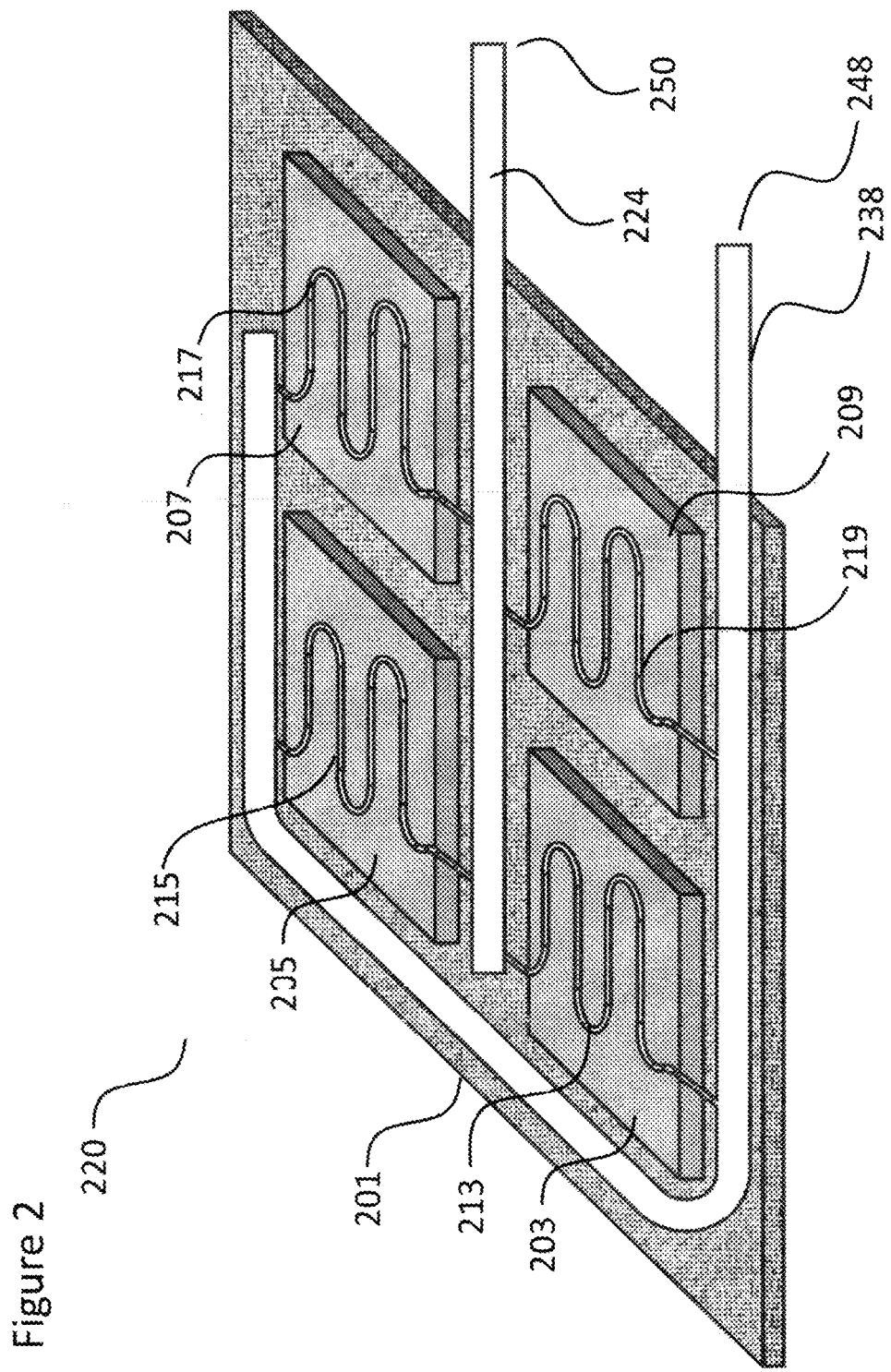
FIG. 2 depicts a schematic view of a regular IC cooling method that may be utilized to cool the computer in accordance with one embodiment of the present invention.

FIG. 2 schematically illustrates an enlarged view of the server 220 disposed in the server rack 114 of FIG. 1. The server 220 includes the board 201 configured to accommodate components. The board 201 supplies mechanical holding to components and electrical interconnection among the devices. The board 201 can be a printed circuit board (PCB) or silicon interposer. In one embodiment, the board 201 holds a MPU 203, a memory package 205, a power-supply chip 207, and a memory storage 209. The server 220 also accommodates a supply conduit 248, a return conduit 250, a MPU cooling conduit 213, a memory cooling conduit 215, a power cooling conduit 217, and a store cooling conduit 219, wherein the liquid coolant 238 flows for heat exchanging.

The cross-sectional areas of liquid conduits may vary for cooling effectiveness. In one embodiment, the cross-sectional areas of the supply conduit 248 and the return conduit 250 are significantly larger than those of the MPU cooling conduit 213, the memory cooling conduit 215, the power cooling conduit 217, and the store cooling conduit 219.

During cooling processing, the liquid coolant 238 is circulated in a closed loop shown in FIG. 1. Liquid conduits shown in FIG. 2 are part of the total closed loop. In order to have effective heat exchanges between devices and the liquid coolant 238, moderate flow rate in heat-generating components should be kept. Generally, the turbulent flow in the MPU conduit 213, the memory conduit 215, the power conduit 217, and the storage conduit 219 should be maintained. The pump 156 shown in FIG. 1 drives the flow rate and ensures the effectiveness of heat dissipation.

Heat dissipation makes temperature in the return conduit 250 higher than that in the supply conduit 248. The higher temperature difference between these two conduits means more energy carried out at a same flow rate. However, low temperature difference should be kept in order to have a more uniform temperature on the heat-generating components. The non-uniformity of temperature may introduce extra stress, resulting in reliability issues. Typical temperature difference between the supply conduit 248 and return conduit 250 is about 20° C.

MPUs consume most power in a computer system. Effective contact between the MPU conduit 213 and the MPU 203 is the key to cool the MPU. The plane ship of the MPU 203 generally makes the realization of thermal contact easy. However, common memory chips are packaged in single in-line memory module (SIMM) or dual in-line memory module (DIMM), which has a non-plane shape, resulting in challenges in thermal contact effectiveness.

Recently, 3D ICs stacked by using through silicon via (TSV) provide an effective way to make DRAM package have a plane geometry. In one embodiment of this disclosure, stacked DRAM as the memory package 205 is used for the server 220. Therefore, the memory package 205 has a plane for obtaining effective thermal contact between the liquid coolant 238 and the memory package 205.

Generally, power chip 207 is attached to a large radiator for dissipating heat into air. In one embodiment of this invention, the power conduit 217 will be attached to the power chip 207 for effective heat dissipation.

Sometime, a server includes the storage 209. In one embodiment, the storage 209 is a solid-state storage. In another embodiment, the storage 209 is a hard driver. In any case, the storage conduit 219 will provide effective heat dissipation.

In one embodiment, heat-generating components are modules, but there are some passive components which release small amount of heat. For releasing this heat, a cooling conduit may be thermally contacted with the motherboard or interposer to dissipate heat.

Figure 3:
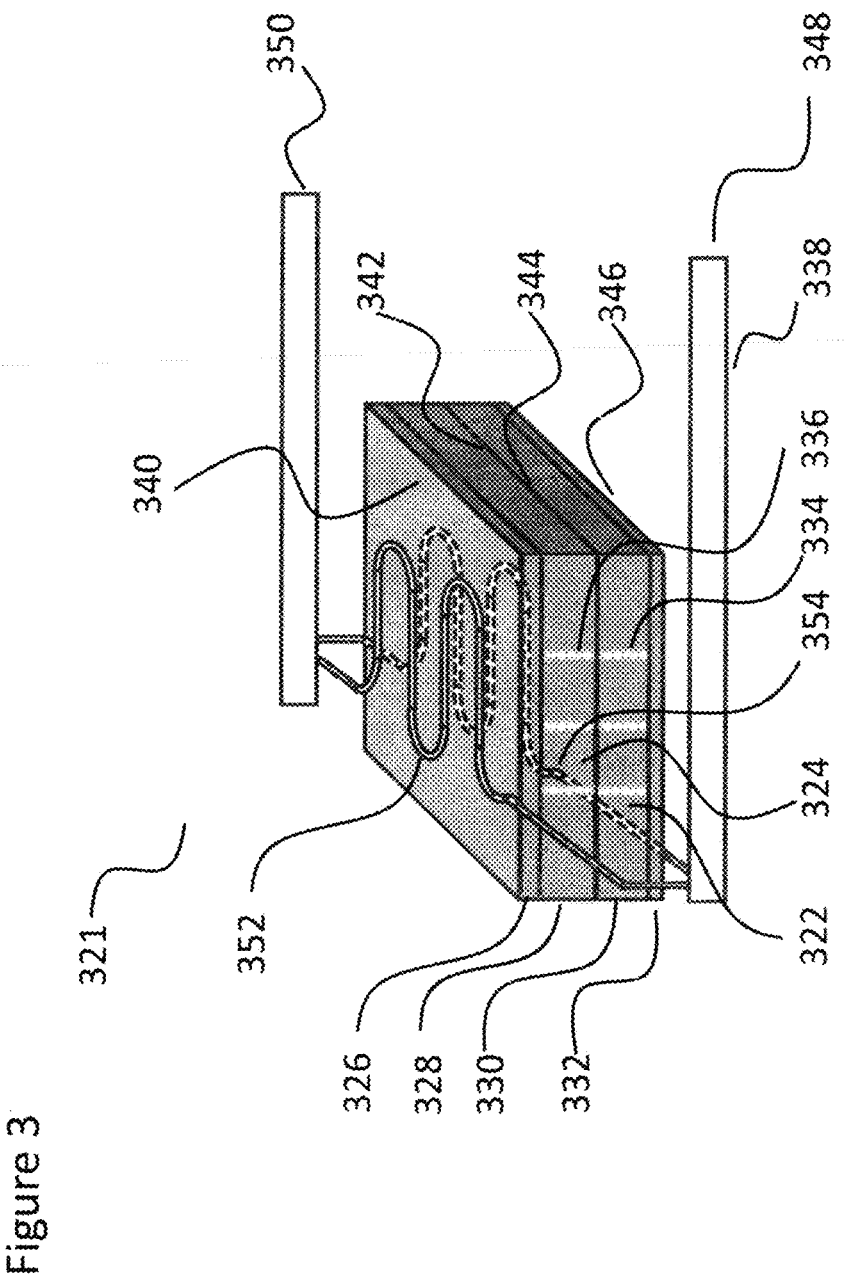
FIG. 3 depicts a schematic view of a 3D IC cooling method that may be used for cooling computer in accordance with one embodiment of the present invention.

FIG. 3 schematically illustrates an enlarged view of a stacked 3D IC 321 of the server 120 disposed in the server rack 114 of FIG. 1. The 3D IC 321 includes a microprocessor 322, a memory 324, a microprocessor liquid conduit 354 configured to flow a liquid coolant 338 thermally contacting with the microprocessor 322, a memory liquid conduit 352 configured to flow the liquid coolant 338 thermally contacting the memory 324.

The microprocessor 322 has a front side 346, a back side 344, a device layer 332, a silicon layer 330, and a plural of TSV 334. Electricity is mostly consumed at the device layer 332, so that this layer becomes the main heat-generating component. In one embodiment, the liquid coolant 338 flows in the microprocessor conduit 354 for carry out heat from the microprocessor 322.

In one embodiment, the memory 324 has a memory front side 340, a memory back side 342, a memory device layer 326, a memory silicon layer 328, and a plural of memory TSV 336. The memory back side 342 is bonded with the microprocessor back side 344 for mechanical and electric interconnection between the microprocessor 322 and the memory 324.

The cross-sectional areas of liquid conduits impact cooling effectiveness. In one embodiment, the cross-sectional areas of the supply conduit 348 and the return conduit 350 are significantly larger than those of the MPU liquid conduit 354 and the memory liquid conduit 352.

During cooling processing, the liquid coolant 338 is circulated in a closed loop shown in FIG. 1. Liquid conduits shown in FIG. 3 are part of the total closed loop. In order to have effective heat exchanges between heat-generating components and the liquid coolant 338, moderate flow rate in liquid conduits of heat-generating components should be kept. Generally, the turbulent flow in MPU liquid conduit 354 and the memory liquid conduit 352 should be maintained. The pump 156 shown in FIG. 1 drives the flow rate and the valve 154 controls the flow rate to ensure the effectiveness of heat dissipation.

Heat dissipation makes temperature in the return conduit 350 higher than that in the supply conduit 348. The higher temperature difference between these two conduits means more energy carried out at a same flow rate. However, low temperature difference should be kept in order to have a more uniform temperature on the heat-generating components. The non-uniformity of temperature may introduce extra stress, resulting in reliability issues. Typical temperature difference between the supply conduit 348 and return conduit 350 is about 20° C.

MPUs consume most power in a computer system. Effective contact between the MPU liquid conduit 354 and the MPU 322 is the key to cool the MPU. The plane ship of the MPU 322 generally makes the realization of thermal contact easy. However, common memory is packaged in single in-line memory module (SIMM) or dual in-line memory module (DIMM), which has a non-plane shape, resulting in challenges in thermal contact effectiveness.

Recently, 3D ICs stacked by using TSV provide effective way to make DRAM package have a plane geometry. In one embodiment of this invention, stacked DRAM as the memory 324 is used for the stacked 3D IC 321. Therefore, the memory 324 has a plane for obtaining effective thermal contact with the liquid coolant 338.

In one embodiment, heat-generating components are modules, but there are some passive components which release small amount of heat. For dissipating this heat, a cooling conduit may be thermally contacted with the motherboard or interposer to dissipate heat.

While the foregoing is directed to embodiments of the present invention, other and further embodiments of the invention may be devised without departing from the basic scope thereof, and the scope thereof is determined by the claims that follow.

What is claimed is:

1. A cooling system for a plural of integrated circuits in a computer system, comprising
    a. A first integrate circuit having first bonding side and first non-bonding side;
    b. A second integrated circuit having second bonding side and second non-bonding side, wherein said first bonding side of said first integrated circuit is bonded with said second bonding side of said second integrated circuit using through silicon via interconnect for mechanical bonding and electric interconnection between said first integrated circuit and said second integrated circuit;
    c. One or plural of first heat-exchanging channels configured to be placed in thermal contact with said first non-bonding side of said first integrated circuit;
    d. One or plural of second heat-exchanging channels configured to be placed in thermal contact with said second non-bonding side of said second integrated circuit;
    e. A liquid-liquid heat exchanger including an exchanger conduit and an external surface wherein a liquid coolant flows in said exchanger conduit; said external surface thermally contacts a large water body; heat is dissipated from said liquid coolant in said exchanger conduit to said large water body;
    f. A closed conduit including a supply conduit, said first heat-exchanging channels, said second heat-exchanging channels, a return conduit, and said exchanger conduit of said liquid-liquid heat exchanger; wherein said liquid coolant is configured to be circulated in said closed conduit; said supply conduit is configured to flow said liquid coolant into said first heat-exchanging channels and said second heat-exchanging channels; a return conduit is configured to flow said liquid coolant out of said first heat-exchanging channels and said second heat-exchanging channels; said supply conduit and said return conduit have larger cross-sectional areas for flowing of said liquid coolant than sum of cross-sectional areas of said first heat-exchanging channels and second heat-exchanging channels;
    g. A pump configured to drive circulating of said liquid coolant in said closed conduit;
    h. A means for controlling flow rate of said liquid coolant in said closed conduit;
    i. A means for preventing said external surface of said liquid-liquid heat exchanger from contamination by said large water body.

2. The cooling system of claim 1, wherein said liquid coolant is deionized water or ionic liquid or oil.

3. The cooling system of claim 1, wherein said pump is an electromagnetic pump or a magnetic pump.

4. The cooling system of claim 1, wherein said first integrated circuit is a microprocessor unit and said second integrated circuit is a dynamic random access memory.

5. The cooling system of claim 1, wherein said second integrated circuit is a non-volatile memory chip.

6. The cooling system of claim 1, wherein said large water body is a river or a reservoir or an ocean.

7. The cooling system of claim 1, wherein said computer system is a server.

8. A cooling method for a plural of integrated circuits in a computer system, comprising a. Providing a first integrated circuit and a second integrated circuit;
b. Providing a first component liquid conduit configured for a liquid coolant having thermal contact with said first integrated circuit;
c. Providing a second component liquid conduit configured for said liquid coolant having thermal contact with said second integrated circuit;
d. Providing a liquid-liquid heat exchanger having a heat-exchanging conduit and an external surface configured to thermally contact the a water in a large water body; wherein said liquid coolant dissipates heat to said water in said large water body;
e. Circulating said liquid coolant in said first component liquid conduit, said second component liquid conduit, and said heat-exchanging conduit for carrying out heat from said first integrated circuit and said second integrated circuit, and dissipating heat to said large water body;
f. Providing a means for said liquid coolant having a controllable flow rate on said first component liquid conduit and said second component liquid conduit;
g. Dissipating heat from said liquid coolant in said heat-exchanging conduit to said water flowing in said large water body;
h. Providing a means adjusting flow rates in said first component liquid conduit and in said second component liquid conduit.

9. The cooling system of claim 8, wherein said large water body is a river, or a reservoir, or an ocean.

10. The cooling system of claim 8, where said liquid coolant is a deionized water, or oil, or ionic liquid.

11. The cooling system of claim 8, wherein said computer system is a server.

12. The cooling system of claim 8, wherein said first integrated circuit is a microprocessor unit.

13. The cooling system of claim 8, wherein said second integrated circuit is a dynamic random access memory.

14. The cooling system of claim 8, wherein said second integrated circuit is a non-volatile memory chip.

15. The cooling system of claim 8, wherein said means adjusting flow rates in said first component liquid conduit and in said second component liquid conduit include one or plural of electromagnetic pump and one or plural of valves.

* * * * *